(12) United States Patent
Singh

(10) Patent No.: US 7,612,540 B2
(45) Date of Patent: Nov. 3, 2009

(54) LITHIUM-ION BATTERY DIAGNOSTIC AND PROGNOSTIC TECHNIQUES

(75) Inventor: Harmohan N. Singh, Rockaway, NJ (US)

(73) Assignee: Honeywell International Inc., Morristown, NJ (US)

( * ) Notice: Subject to any disclaimer, the term of this patent is extended or adjusted under 35 U.S.C. 154(b) by 290 days.

(21) Appl. No.: 11/552,287

(22) Filed: Oct. 24, 2006

(65) Prior Publication Data
US 2008/0094029 A1    Apr. 24, 2008

(51) Int. Cl.
*H02J 7/04* (2006.01)
*H02J 7/16* (2006.01)
*H02J 7/00* (2006.01)

(52) U.S. Cl. ..................... 320/162; 320/126

(58) Field of Classification Search ............... 320/116, 320/118, 119, 120, 121, 122, 157–159, 160, 320/162, 164; 324/433, 434
See application file for complete search history.

(56) References Cited

U.S. PATENT DOCUMENTS

| | | | |
|---|---|---|---|
| 6,020,718 A | 2/2000 | Ozawa et al. | |
| 6,242,893 B1* | 6/2001 | Freedman | 320/135 |
| 6,268,710 B1* | 7/2001 | Koga | 320/116 |
| 6,278,257 B1* | 8/2001 | Takada et al. | 320/116 |
| 6,930,466 B2* | 8/2005 | Bradley et al. | 320/133 |
| 2005/0275373 A1* | 12/2005 | Guang et al. | 320/116 |
| 2006/0103351 A1* | 5/2006 | Tanigawa et al. | 320/118 |

FOREIGN PATENT DOCUMENTS

| | | |
|---|---|---|
| DE | 4033119 A1 | 4/1991 |
| GB | 2275783 A * | 9/1994 |
| WO | WO 2007/102521 A | 9/2007 |

OTHER PUBLICATIONS

European Search Report dated Feb. 21, 2008.

* cited by examiner

*Primary Examiner*—Edward Tso
*Assistant Examiner*—Ahmed Omar
(74) *Attorney, Agent, or Firm*—Oral Caglar, Esq.

(57) ABSTRACT

Embodiments provide a method and a system for determining cell imbalance condition of a multi-cell battery including a plurality of cell strings. To determine a cell imbalance condition, a charge current is applied to the battery and is monitored during charging. The charging time for each cell string is determined based on the monitor of the charge current. A charge time difference of any two cell strings in the battery is used to determine the cell imbalance condition by comparing with a predetermined acceptable charge time difference for the cell strings.

11 Claims, 4 Drawing Sheets

LITHIUM-ION BATTERY DIAGNOSTIC AND PROGNOSTIC TECHNIQUES

GOVERNMENT RIGHTS

This invention was made with government support under Contract No. DAAD19-01-2-00100 awarded by the United States Army Research Laboratory to the Power and Energy Consortium. The government may have certain rights in the invention.

FIELD OF THE INVENTION

This invention relates generally to multi-cell batteries, and, more particularly, to a method and a system for diagnosing and/or determining impending cell imbalance condition of a multi-cell battery.

BACKGROUND OF THE INVENTIONS

Lithium-ion (Li-ion) or lithium-polymer (Li-polymer) batteries are relatively new rechargeable batteries that may be used in systems that need to maximize run time. Typically, these batteries are configured as battery arrays, packs, or strings. The battery arrays, packs, or strings may include two cells (e.g., for consumer products such as camcorders or cameras), or up to four or more cells (e.g., for high-end notebook computers, automobile, aircraft). These multi-cell arrays, packs, or strings can be coupled in series and a number of series cell strings can be connected in parallel.

In multi-cell batteries, problems may arise due to differences in the characteristics of the individual cells, i.e., cell capacities. The difference in the cell ampere-hour (Ah) capacities is referred to as cell imbalance. In a new battery, the cells should be well balanced. Cell imbalance may develop, however, due to aging or other causes, such as, for example, insertion of different grade cells due to repair, battery misuse or differences in the active materiel quality of the cells at the time of cell manufacturing.

Because of these and other problems resulting from cell imbalance, cell balancing techniques are needed to equalize the charge on every cell and prevent individual cells from becoming over stressed. However, few techniques exist for diagnosing and/or predicting a cell imbalance condition for these batteries. Thus, there is a need to overcome these and other problems of the prior art and to provide a method and a system for diagnosing and/or determining impending cell imbalance of a battery, a battery array, pack, or string.

SUMMARY OF THE INVENTION

According to various embodiments, the present teachings include a method for determining cell imbalance of a battery. The battery includes a plurality of cell strings. Each cell string includes a plurality of battery cells. To determine a cell imbalance condition, a charge current is applied to the battery. The charging of each cell string of the battery is then monitored and controlled by comparing a voltage per cell of the cell string with a safe voltage limit. Specifically, if the safe voltage limit is an upper limit for every voltage per cell, the charging of the cell string is enabled. On the other hand, if any voltage per cell is higher than or equal to the safe voltage limit, the charging of the cell string is disenabled.

According to various embodiments, the present teachings also include a method for determining cell imbalance of a multi-cell battery. The battery can include a plurality of cell strings. To determine cell imbalance of the battery, a charge current is applied to the battery and monitored during charging. Based on the monitor of the battery charge current, a charge time is counted for each cell string of the battery. Thus, a charge time difference between any two cell strings is then determined and compared with a predetermined acceptable charge time difference between the cell strings. A cell imbalance condition of the battery occurs when any charge time difference is greater than the predetermined acceptable charge time difference.

According to various embodiments, the present teachings further include a system for determining cell imbalance of a multi-cell battery. In this system, a charger is configured to provide a charge current to the multi-cell battery. A voltage per cell in the multi-cell battery is then monitored by a series of voltage sensors. A logical or of output of the series of voltage sensors is received by an OR gate. Based on the logical level received, the OR gate controls the charging process via a switch.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE EMBODIMENTS

Reference will now be made in detail to exemplary embodiments of the invention, an example of which is illustrated in the accompanying drawings. Wherever possible, the same reference numbers will be used throughout the drawings to refer to the same or like parts.

In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10 e.g., 1 to 5.

As shown in FIGS. 1-4, in a rechargeable system, a battery may be charged starting in a constant current mode and then in a constant voltage mode. The charge mode may be selected according to the battery State-of-Charge. To diagnose and/or predict a cell imbalance condition during charging, voltage and current of the battery may be monitored to control the charging process. In various embodiments, the voltage and the current for each cell string or even each cell of the battery may be monitored to control the charging process and to diagnose and/or predict the cell imbalance condition.

Figure 1:
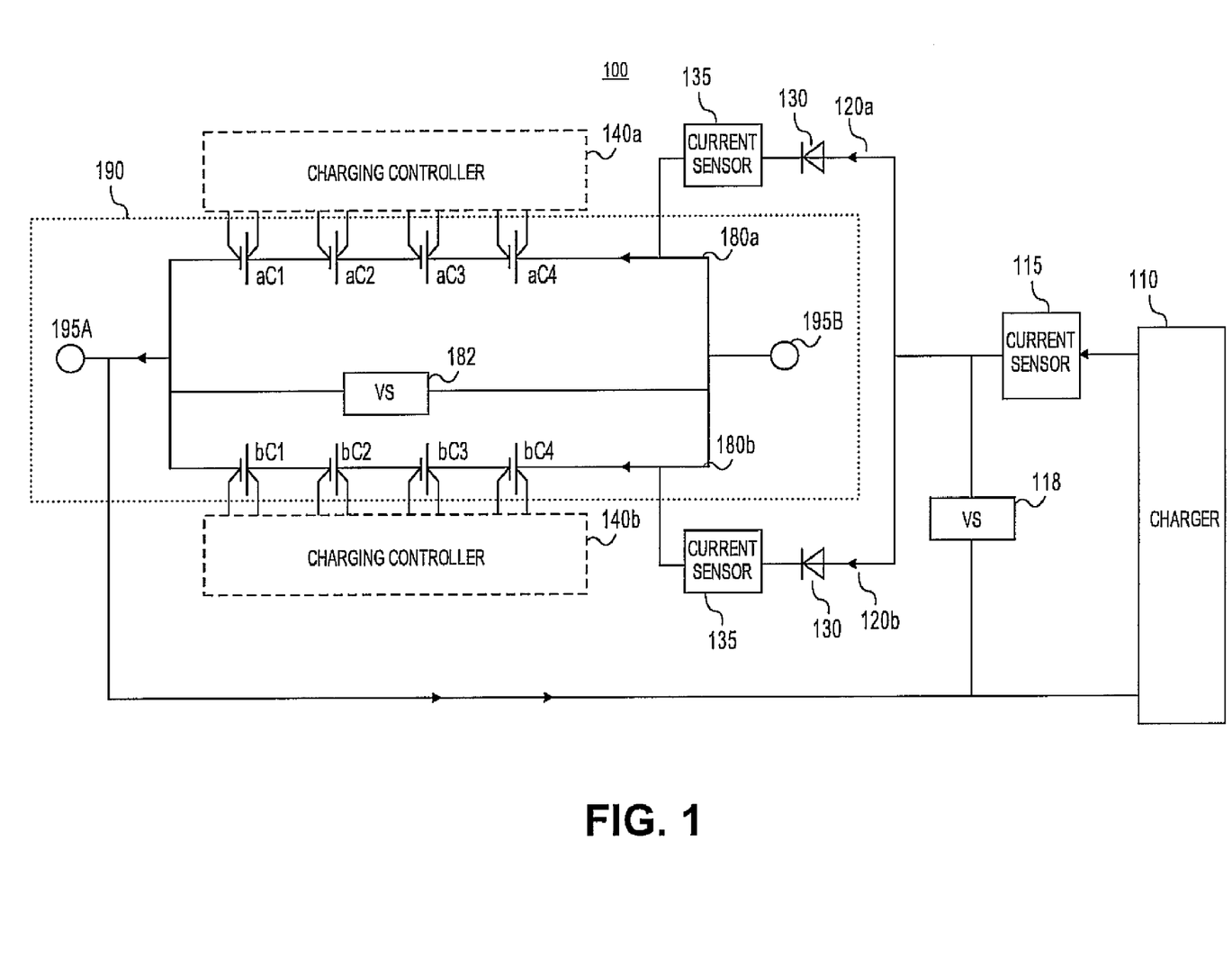
FIG. 1 depicts an exemplary system 100 for monitoring and controlling charging process of a battery in accordance with the present teachings.

FIG. 1 depicts an exemplary system 100 for diagnosing and/or determining an impending cell imbalance condition of a multi-cell battery by monitoring and controlling its charging process. It should be readily obvious to one of ordinary skill in the art that the system 100 depicted in FIG. 1 represents a generalized schematic illustration and that other devices or cells may be added or existing devices or cells may be removed or modified.

As shown in FIG. 1, the system 100 may include a charger 110, a current sensor 115, a voltage sensor 118, and charging circuits 120a-b. The charger 110 may provide a charge current distributed into the charging circuits 120a and 120b and the charge current may then return to the charger 110, as indicated by arrows in FIG. 1. The current sensor 115 may be configured in series with the charging circuits 120a-b. The voltage sensor 118 may be configured to measure a voltage across the charging circuits 120a-b.

The charger 110 may be, for example, a power supply, such as, a programmable power supply. The charger 110 may be a Hewlett-Packed model 6032 A power supply. The current sensor 115 may be configured to detect the charge current from the charger 110. The current sensor 115 may be an ammeter, a current shunt or a similar functioning device. In various embodiments, the current sensor 115 may be placed within the charger 110.

The voltage sensor 118 may be a voltage sensing component such as an analog comparator, that may measure the voltage across a corresponding device, such as the charging circuits 120a-b of a battery, which will be described later. In various embodiments, the voltage sensor 118 may be connected at the common anode connection of the blocking diodes (described later) in the charging circuit 120. The charging circuits 120a and 120b may be configured in parallel sharing the charge current from the charger 110. In various embodiments, the system 100 may include a desired number of charging circuit 120.

Each charging circuit 120 may include a blocking diode 130, a current sensor 135, a charging controller 140, a cell string 180 and a voltage sensor 182. As indicated by arrows in FIG. 1, the charge current may travel through the blocking diode 130, the current sensor 135 and the cell string 180 and return to the charger 110.

The block diode 130 may be used to limit the direction of current flow so that the current flows only from the charger 110 during charging. In various embodiments, one or more of the blocking diode 130, the current sensor 135, or the charging controller 140 may be configured within the charger 110.

The current sensor 135 may be configured to detect the current of the corresponding charging circuit 120. The current sensor 135 may be, for example, an ammeter, a current shunt or a similar functioning device. In various embodiments, the current sensor 135 may be located within the charging controller 140.

Figure 2:
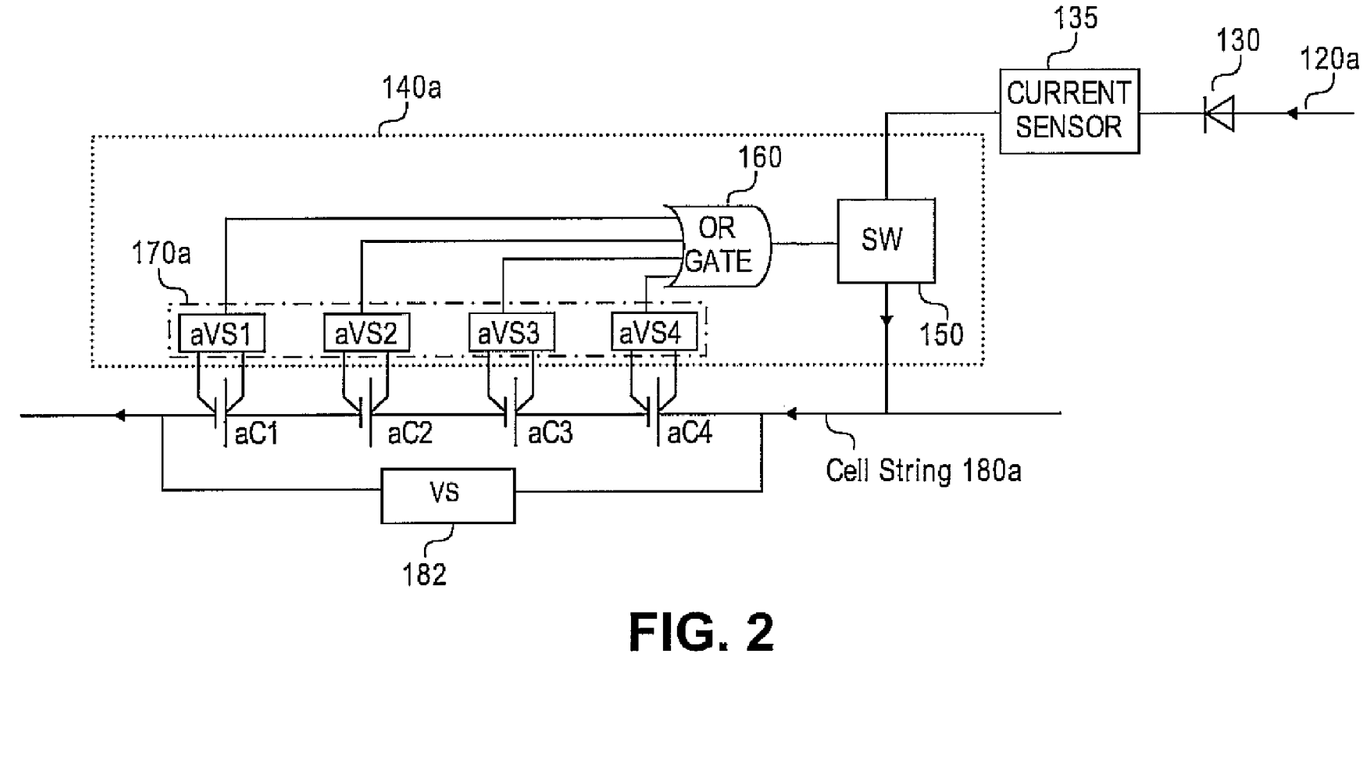
FIG. 2 depicts a portion of a charging system illustrated in FIG. 1 in accordance with the present teachings.

The charging controller 140, such as 140a or 140b in FIG. 1, may be configured to control the charging process of the cell string 180, such as 180a or 180b, accordingly. FIG. 2 depicts a portion of the charging circuit 120 such as 120a in FIG. 1 including the block diode 130 and the current sensor 135 that have been described previously. FIG. 2 also depicts an exemplary structure for the charging controller 140 such as 140a, the cell string 180 such as 180a and the voltage sensor 182.

As shown in FIG. 2, the charging controller 140 may include a switch SW 150, an OR gate 160, and a series of voltage sensors 170.

The switch SW 150 may be an analog switch configured to control the corresponding charging circuit 120. For example, when the SW 150 is enabled, the charging circuit 120 may be connected. A charge current for the charging circuit 120 may then be detected by the current sensor 135. When the SW 150 is disenabled, the charging circuit 120 may be disconnected.

The OR gate 160 may be configured to connect the SW 150 with the series of voltage sensors 170, such as 170a in FIG. 2. The OR gate 160 may receive a level from the output of the series of voltage sensors 170. The logic level, in the present example, is logic '0' when the cell voltage is below the limit voltage and logic '1' when the cell voltage is above the limit voltage. Based on the logical level received, the OR gate 160 may control the SW 150 to either enable or disenable the charging circuit 120. In various embodiments, other suitable logic scheme may be used to control the SW 150, such as, for example, an AND gate. For an exemplary AND gate, the logic level may be "1" when the cell voltage is below the limit voltage and "0" when the cell voltage is above the limit voltage.

The series of voltage sensors 170 may include one or more voltage sensors, for example, 4 voltage sensors VS1, VS2, VS3 and VS4. The voltage sensors may be a voltage sensing component such as an analog comparator that may compare the cell voltage across a corresponding device with a reference voltage representing the limit voltage. The corresponding device in the present illustration is a cell. In various embodiments, at least one series of voltage sensors 170 may be included and each series of voltage sensors 170 may include one or more voltage sensors depending on the battery configurations. For example, the exemplary system 100 may include two series of voltage sensors 170a-b (170b not shown). The series of voltage sensors 170a for charging circuit 120a may include voltage sensors, such as, aVS1, aVS2, aVS3, and aVS4 as shown in FIG. 2. Accordingly, the series of voltage sensors 170b (not shown) in charging circuit 120b may include voltage sensors, such as, bVS1, bVS2, bVS3, and bVS4.

As detailed in FIG. 2, the cell string 180 may be connected with the series of voltage sensors 170 of the charging controller 140. In various embodiments, the system 100 may include at least one cell string 180 in parallel and each cell string 180 may include one or more battery cells in series. For example, as shown in FIG. 1, the cell string 180a may include a series of battery cells, such as, aC1, aC2, aC3, and aC4. The cell string 180b may include a series of battery cells, such as, bC1, bC2, bC3, and bC4. As shown in FIG. 2, each cell in the cell string 180 may be connected to a voltage sensor in the series of voltage sensors 170. Each voltage sensor may be used to monitor the voltage of its corresponding cell. For example, voltage sensor aVS1 in 170a may monitor the voltage across the cell aC1 in the cell string 180a, voltage sensor aVS2 may monitor the voltage across the cell aC2, voltage sensor bVS3 in 170b (not shown) may monitor the voltage across the cell bC3 in the cell string 180b (see FIG. 1), voltage sensor bVS4 (not shown) may monitor the voltage across the cell bC4 (see FIG. 1), etc. In various embodiments, the cell string 180 may include one or more cell substrings that may include one or more battery cells connected with and monitored by voltage sensors.

The voltage sensor 182 shown in FIGS. 1-2 may be configured to monitor the voltage across the cell strings 180 of the battery. The voltage sensor 182 may be an analog comparator. In various embodiments, the voltage sensor 182 may be located in the charging controller 140.

Turning to FIG. 1, the one or more parallel cell string 180 such as cell strings 180a-b may form a battery 190 for the system 100. The battery 190 may further include a housing with positive and negative terminals 195A-B.

In various embodiments, the battery 190 may also be installed within a vehicle, a platform or in a standalone bench top system. When the battery 190 is installed, for example, in the vehicle to power various applications, such as a starter motor, lighting, air conditioning, instruments, etc., the positive and negative terminals 195A-B may be connected to the vehicle's electrical system. The battery 190 may be a lithium-ion battery, or a lithium-polymer battery. The battery 190 may be rechargeable. In various embodiments, the battery 190 may be configured to include the charging controllers 140 a-b, the voltage sensor 182, the current sensors 135 and/or the block diodes 130 (see FIG. 1).

The battery 190 may be charged starting in a constant current mode at a maximum recommended charge current, such as, for example, 1 Ampere. After being charged in the constant current mode, a constant voltage mode may then be used to charge the battery 190.

In a rechargeable system, such as a rechargeable lithium system, it is a safety requirement to monitor and control the voltage of each cell/cell string/battery during charging. Specifically, the voltage of each cell may not be allowed to exceed a predetermined safe voltage limit ($V_{limit}$), which may be determined by the type of the battery cells. For example, $V_{limit}$ may be 4.1 volts per cell for a lithium-ion rechargeable battery.

For each cell string, the limit voltage may be determined by both a limited voltage per cell $V_{limit}$ (e.g., $V_{limit}$=4.1 volts for lithium-ion type batteries) and the number (n) of cells in the cell string as ($V_{limit} \times n$). For example, in FIGS. 1-2, each cell string 180 may include 4 lithium-ion type cells (i.e., n=4). In this case, the voltage limit for the cell string 180 may be calculated as 16.4 volts during charging.

When charging the battery 190 in the constant current mode, the voltage monitor may be performed by the voltage sensor 182 across the cell string 180 (see FIGS. 1-2). When the cell string voltage ($V_{string}$) reaches the voltage limit, for example, 16.4 volts for the cell string 180. The charging process may switch to a constant voltage mode and this voltage (i.e., 16.4 volts) may be used, monitored and maintained.

Alternatively, the voltage monitor may be conducted by the voltage sensor 118 (see FIG. 1), when the battery is charged in the constant current mode. For example, the voltage sensor 118 may be used to monitor the voltage across the entire charging circuits 120 for the battery 190 as $V_{battery}$. In this case, $V_{battery}$ may include cell string voltage $V_{string}$ plus a built-in potential of the blocking diode 130, which may be a defined value for certain diode such as, for example, 0.7 volts for a silicon-based blocking diode 130. Accordingly, the voltage limit for $V_{battery}$ may be 17.1 volts (i.e., (16.4 plus 0.7) volts). Likewise, once the battery voltage $V_{battery}$ reaches its voltage limit (17.1 volts in this example), this voltage may then be used, monitored and maintained for subsequent charging, which may switch to the constant voltage mode.

Figure 3:
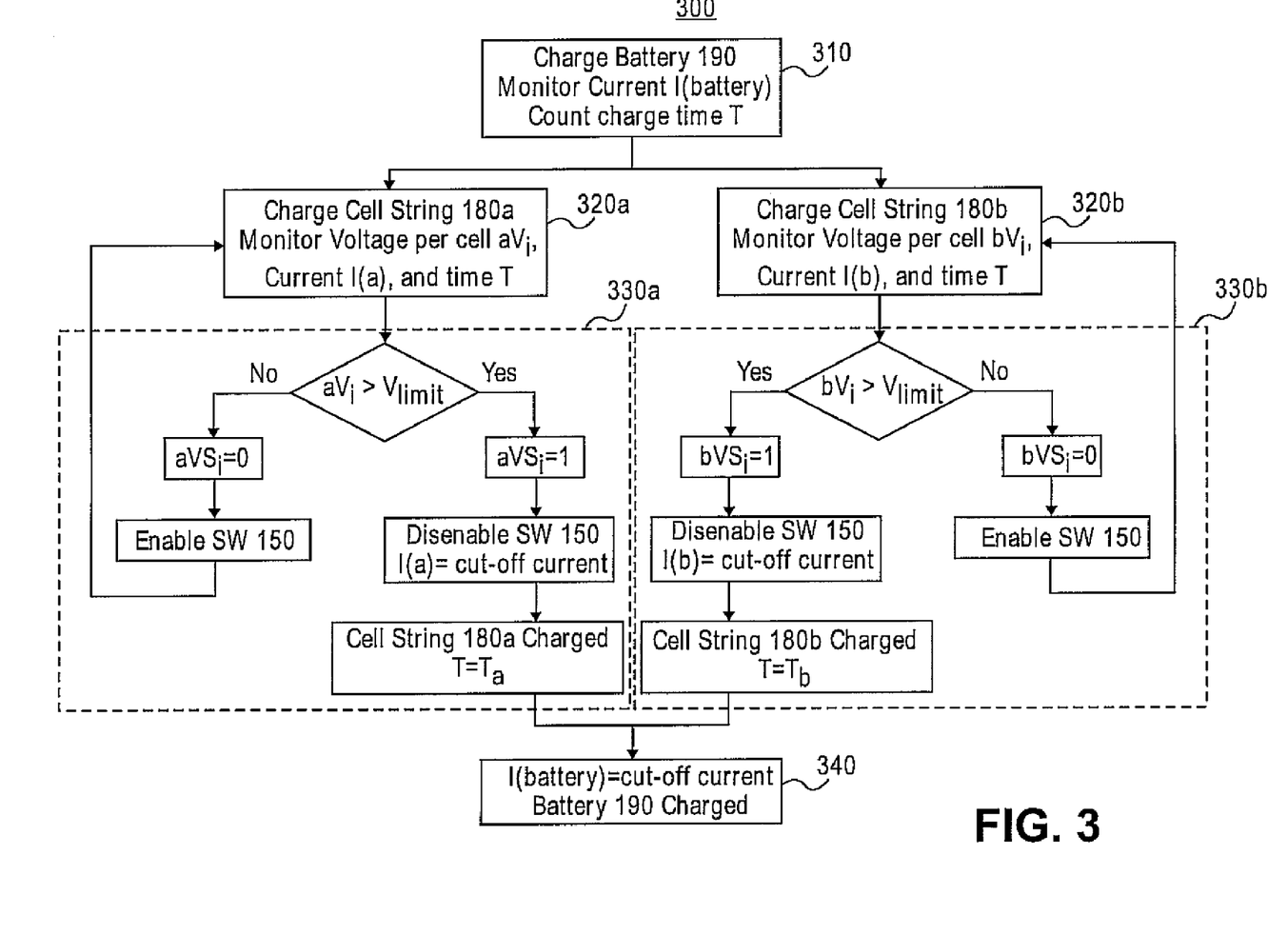
FIG. 3 an exemplary method 300 for monitoring and controlling the charging process illustrated in FIGS. 1-2 in accordance with the present teachings.

FIG. 3 is a block diagram showing an exemplary method 300 for monitoring and/or controlling the charging process of the battery 190 based on the exemplary system 100 illustrated in FIGS. 1-2. It should be readily obvious to one of ordinary skill in the art that the method 300 depicted in FIG. 3 represents a generalized schematic illustration and that other parameters may be added or existing parameters may be removed or modified.

In the method 300, the charge current to the battery or each cell string, voltage per cell $V_i$ in the cell string and a charge time T of the cell string or the battery may be monitored from the start of the constant voltage mode. The charge time T may be monitored by a time counter or a processor (not shown), which may be connected with current sensors, such as, for example, the current sensor 118 or 135 in FIG. 1 and/or the charger 110.

As shown in FIG. 3, at 310, the battery 190 may be charged by charger 110 and the battery charge current I(battery) may be measured by the current sensor 115 (see FIG. 1). The charge current I(battery) may be distributed into two charging circuits 120a-b as I(a) and I(b). Thus, I(battery)=I(a)+I(b). In addition, when the charging mode switches to the constant voltage mode, the charge time T may start to count.

At 320a for the charging circuit 120a, the voltage per cell (cell voltage) in the cell string 180a is $aV_i$, where i may be 1, 2, 3, 4 for cells aC1, aC2, aC3, and aC4, may be monitored by its corresponding voltage sensor of 170a. As the battery charges, cell voltage ($aV_i$) may increase. Moreover, the charge current I(a) for the cell string 180a may be monitored by the current sensor 135. Further, the elapsed time for the cell string 180a may continue to count during charging.

At 330a, each cell voltage ($aV_i$) of the cell string 180a may be compared with the safe voltage limit ($V_{limit}$) per cell during charging. More specifically, if any cell voltage reaches the safe voltage limit ($V_{limit}$) such as 4.1v for a lithium battery, the corresponding voltage sensor may output a logic level "1". Accordingly, the OR gate 160 may receive a logical or of "1", i.e. $aVS_i$=1, where i may be 1, 2, 3, and 4 for cells aC1, aC2, aC3 and aC4. And the OR gate 160 may respond to disenable the SW 150 and thus disconnect the charging circuit 120a. As a result, the current I(a) to the cell string 180a may be reduced to a cut-off current, that may be a predetermined current value indicating a charge completion for the cell string 180a. In addition, when the current I(a) to the cell string 180a reaches the cut-off current, the charge time may be recorded as time $T_a$.

On the other hand, if every cell voltage ($aV_i$) of the cell string 180a is below the safe voltage limit ($V_{limit}$), the logic level output of all corresponding voltage sensor ($aVS_i$) in 170a may be a "0", i.e. $aVS_i$=0, where i may be 1, 2, 3, or 4. Accordingly, the OR gate 160 may receive a logical level of "0" for a safe information and respond to enable the SW 150 and thus enable the charging circuit 120a to continue charging the cell string 180a.

At 320b, the charging circuit 120b may be monitored and controlled similarly as for the charging circuit 120a at 320a.

More specifically, the cell string 180*b* may be charged and the charge current I(b) may be monitored by the current sensor 135 of the charging circuit 120*b*. Every cell voltage as $bV_i$, where i may be 1, 2, 3, 4 for cells bC1, bC2, bC3, and bC4 (see FIG. 1) may be monitored by its corresponding voltage sensor in 170*b* (not shown). Further, the elapsed charge time for the cell string 180*b* may continue to count during charging.

At 330*b*, similarly to 330*a*, each cell voltage ($bV_i$) of the cell string 180*b* may be compared with the safe voltage limit ($V_{limit}$) during charging. More specifically, if any cell voltage reaches the safe voltage limit ($V_{limit}$) such as 4.1v for a lithium battery, the corresponding voltage sensor in 170*b* (not shown) may output logic level "1". Accordingly, the OR gate 160 may receive a logical input of "1", i.e. $aVS_i=1$, where i may be 1, 2, 3, and 4 for cells bC1, bC2, bC3 and bC4. And the OR gate 160 may respond to disenable the SW 150 and thus disconnect the charging circuit 120*b*. As a result, the current I(b) to the cell string 180*b* may be reduced to a cut-off current, that may be a predetermined current value indicating of a charge completion for cell string 180*b*. In addition, when the current I(b) to the cell string 180*b* reaches the cut-off current, the charge time may be recorded as time $T_b$.

On the other hand, if every cell voltage ($bV_i$) of the cell string 180*b* is below the safe voltage limit ($V_{limit}$), the logic level output of all the corresponding voltage sensor ($bVS_i$) in 170*b* (not shown) may be a "0", i.e. $aVS_i=0$, where i may be 1, 2, 3, or 4. Accordingly, the OR gate 160 may receive a logical level of "0" for a safe information and respond to enable the SW 150 and thus enable the charging circuit 120*b* to continue charging the cell string 180*b*.

At 340, when all cell strings (e.g., 180 *a-b*) reach the safe voltage limits and are disconnected from charging, the battery charge current I(battery) may be reduced to a cut-off current indicating charge completion for the battery 190. In this case, the cut-off current may be reduced to zero since all cell strings are cut-off.

Thus, if one of cell strings 180*a-b* reaches safe voltage limits for the battery 190, a corresponding charge current, i.e., one of I(a) and I(b), may be cut-off, and the corresponding cell string charge time (i.e., one of $T_a$ and $T_b$) may be monitored. Meanwhile, the battery charge current I(battery) may be bypassed so that no further charge current is supplied to this cell string, while the other of cell strings 180*a-b* may keep accepting charge current until any or all of cell voltages reaches the safe voltage limit and disconnects the charging process. The charge time (i.e., the other of $T_a$ and $T_b$) of this cell string (also the entire battery 190 in this example) may also be monitored.

Therefore, by monitoring the charge current I(a) and I(b) to individual cell string 180*a* and 180*b* of the battery 190, the charging status of the individual cell string 180*a* or 180*b* and the battery 190 may be determined. In various embodiments, the charging status of the battery 190 may be determined by only monitoring the battery charge current I(battery) in the absence of individual cell string current monitor.

It should be noted that the charging process in the method 300 for determining the cell imbalance of the battery may be monitored at individual cell levels yet controlled at individual cell string levels. That is, whenever any cell in any cell string reaches the cut-off current (the predetermined low current value), the charge to that string may be cut off. In addition, parameters such as the charge time may be used to diagnose and predict the cell imbalance condition at such cell string level.

In various embodiments, the method 300 may also be used to monitor the charge at individual cell levels and also control the charge at individual cell level for the battery 190. For example, as in FIG. 1, an individual cell may be configured to replace each cell string 180, and a plurality of individual cells may be configured in parallel in the battery 190. Accordingly, when one individual cell reaches the voltage limit per cell (e.g., 4.1 volts for a lithium-ion battery cell), the charging to this individual cell may be removed by the corresponding switch and other individual cells may keep accepting the charge current until one of the them reaches the voltage limit per cell, and so on. Thus, the cell imbalance condition of the battery may be diagnosed and predicted at individual cell levels by monitoring and controlling individual cell charging process.

Figure 4:
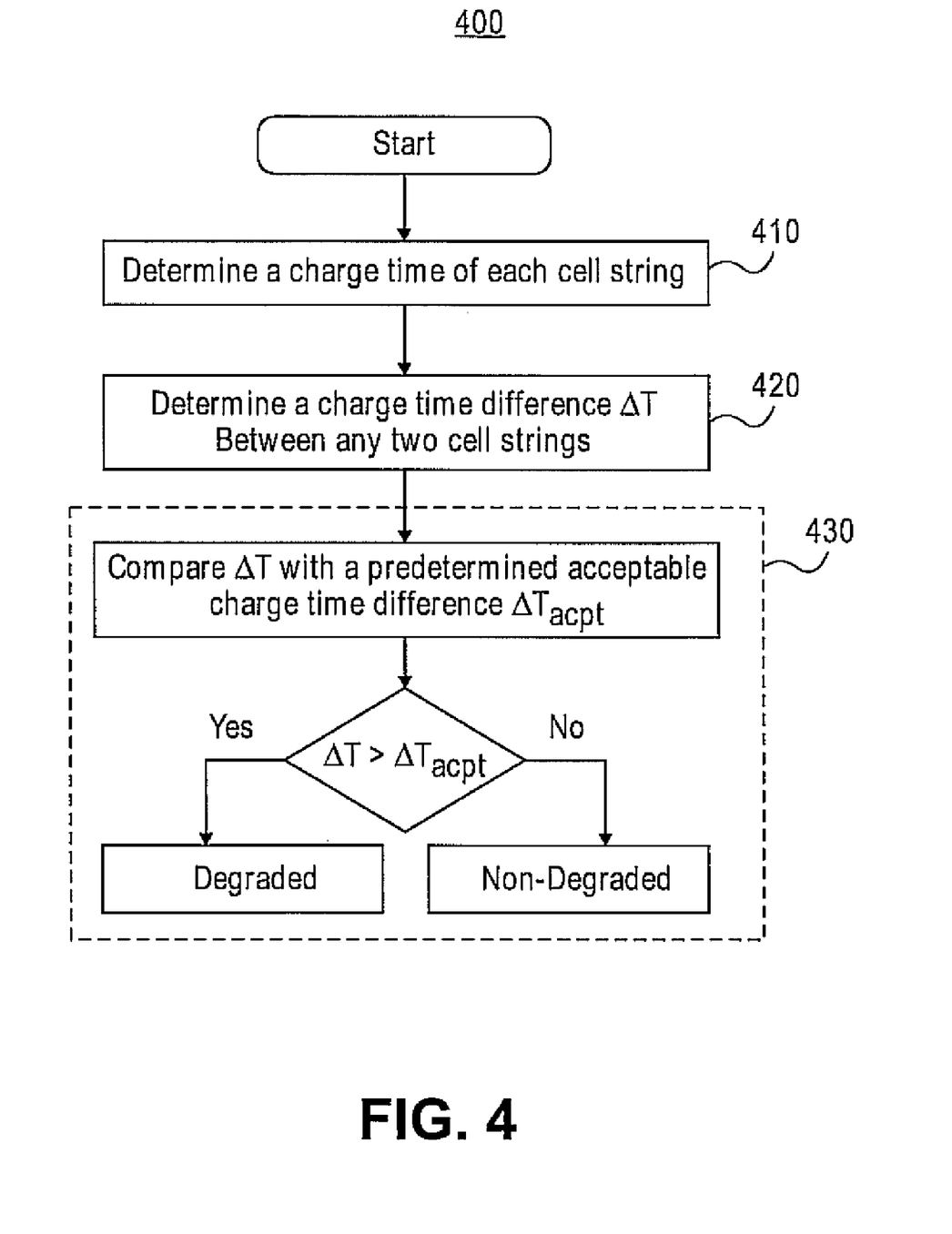
FIG. 4 depicts an exemplary method 400 for diagnosing and/or determining an impending cell imbalance condition of a battery (or an individual cell string) in accordance with the present teachings.

In various embodiments, parameters such as individual cell string charge times (e.g., $T_a$ and $T_b$ in the method 300), and/or a charge time difference ($\Delta T$) between cell strings may be used to predict and/or diagnose the cell imbalance condition of the battery. FIG. 4 depicts an exemplary method 400 for determining the cell imbalance condition of a multi-cell battery, such as the battery 190 in FIG. 1.

At 410, the time elapsed for charging an individual cell string, such as, for example, the charge time $T_a$ and $T_b$ for the cell string 180*a* and 180*b*, respectively, may be determined by the current monitor in each cell string as described above in the method 300. In various embodiments, one or more cell string may be included in the battery 190 and the charge time for each cell string may be obtained. In an embodiment, one or more cell string may be charged with the same charge time.

In various embodiments, the cell string charge times (e.g., $T_a$ and $T_b$) may be determined by a battery charge current I(battery) monitor in the absence of the individual cell string monitor. For example, in the battery 190 without cell string current monitor (i.e., no current sensors 135 used in FIG. 1), when one of the cell strings 180*a* and 180*b* is disconnected from the charge, the battery charge current I(battery) may sense a first sudden current reduction and a first cell string charge time (i.e., one of $T_a$ and $T_b$) may be monitored. When I(battery) senses a second sudden current reduction indicating the other cell string is disconnected, a second cell string charge time (i.e., the other of $T_a$ and $T_b$) may be monitored. Likewise, for a battery with various number of cell strings, a third sudden current reduction may indicate a third cell string is disconnected and its charge time may be monitored, and so on. In various embodiments, one or more cell string of the battery may be disconnected at the same time, i.e., having the same charge tire. Thus, the charge time for individual cell strings may be obtained by only monitoring the battery charge current I(battery).

In various embodiments, there may be an acceptable charge time for a "good" individual cell string. In the case when cell imbalance occurs, the charge time for the individual cell string, such as, for example, $T_a$ or $T_b$ for the cell string 180*a* or 180*b*, may be shorter than the acceptable charge time for this cell string, which may determine an impending cell imbalance condition of the battery.

In various embodiments, for a "good" battery without the cell imbalance condition, the charge times for the cell strings of the battery may be equal or close to each other. However, when the cell imbalance occurs, one of the charge times may be short than the others. For example, if there is no cell imbalance in the battery 190, $T_a$ and $T_b$ for the cell strings 180*a* and 180*b* may be equal or close to each other. When the cell imbalance occurs, one of $T_a$ and $T_b$, may become shorter as compared with the other.

At 420, a charge time difference $\Delta T$ may be determined between any two individual cell strings. For example, in the battery 190, the charge time difference $\Delta T$ may be calculated from |Ta−Tb|, where $T_a$ and $T_b$ is the charge time for individual cell string 180*a* and 180*b* respectively. Accordingly, when one of $T_a$ and $T_b$ is shorter than the other for a cell imbalance, ΔT may increase.

At 430, the calculated charge time difference ΔT may be compared with a predetermined acceptable charge time difference $\Delta T_{acpt}$ to diagnose or predict the cell imbalance condition of the battery 190. A predetermined acceptable charge time difference ($\Delta T_{acpt}$) between cell strings may be a predetermined "safe" charge time difference for a "good" battery.

In various embodiments, when comparing, if the calculated charge time difference ΔT between any two cell strings for a battery falls out of the predetermined acceptable value $\Delta T_{acpt}$ (i.e., ΔT is higher than $\Delta T_{acpt}$), the battery may be determined to be a "degraded" battery with cell strings imbalanced. On the other hand, if any calculated charge time difference ΔT falls in the range of the predetermined acceptable value $\Delta T_{acpt}$ for the battery measured, the battery may be determined to be a "good" or "non-degraded" battery. For example, if the measured ΔT (i.e., |Ta−Tb|) between the two cell strings 180*a*-*b* increases from the predetermined acceptable value $\Delta T_{acpt}$, the battery 190 may be a degraded battery with cell strings imbalanced.

It is noted that, in some cases, the predetermined cut-off current may be somewhat higher, and/or the predetermined safe voltage limit may be somewhat higher, than, for example, 4.1 volts. This may cause the charge current, for example, I(a) or I(b), to reach the predetermined cut-off current prior to any voltage per cell in the respective cell strings (i.e., 180*a* or 180*b*) reaches the safe limit voltage. In this case, for a high quality battery, the switches 150 may not be activated to cut-off the charge of the respective cell string for a period of time, which may be a considerable period of time after the battery has been fielded in the constant voltage charge mode. A high quality battery is the one with low cell degradation according to the board capacity loss and capacity mismatch development with respect to time.

In other cases for a high quality battery, the charge current I(a) or I(b) may have reached the predetermined cut-off current, while none of the switches 150 is activated to cut-off the charging of the respective cell string. As a result, neither $T_a$ nor $T_b$ may be recorded and no degradation (or cell imbalance) can be reported. In another example, there may be only one of the switches 150 activated to cut-off the charge of one of the cell strings 180*a* or 180*b* and resulting in only one charge time recorded. In this case also it is not be possible to perform the battery diagnostics.

The charge time for individual cell string and the charge time difference between the cell strings may be affected by the battery condition. The battery condition may include a State-of-Charge (SOC) level within an assembled battery in use. The SOC level of a battery may generally be defined as the actual charge stored in a given battery capacity divided by the storage capacity of that battery. The SOC level may vary due to aging or other causes, such as insertion of different grade cells, which may reduce the charge time for the corresponding cell string and thus vary the charge time difference.

In various embodiments, charge time difference between cells (as suppose to the cell strings) may be monitored and determined using the method 400. In this case, the cell imbalance may be determined by comparing the charge time difference with a predetermined acceptable charge time difference between cells. Thus, the cell imbalance condition of the battery may be diagnosed and predicted at the individual cells level.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for determining cell imbalance of a battery comprising:
    applying a charge current to a battery comprising first and second cell strings;
    monitoring the battery charge current in the first and second cell strings;
    sensing a first sudden current reduction in the battery charge current;
    determining a first cell string charge time in the first cell string;
    sensing a second sudden current reduction in the battery charge current;
    determining a second cell string charge time in the second cell string;
    comparing the first cell string charge time to the second cell string charge time;
    determining a charge time difference between the first cell string charge time and the second cell string charge time
    determining that a cell imbalance is not present in the battery if the determined charge time difference is less than or equal to a predetermined acceptable charge time difference; and
    determining that a cell imbalance is present in the battery if the determined charge time difference is greater than a predetermined acceptable charge time difference.

2. The method of claim 1 further comprising,
    disenabling charging of the first cell string if a measured current in the first cell string is higher than or equal to a safe current limit.

3. The method of claim 2 further comprising:
    disenabling charging of the second cell string if a measured current in the second cell string is higher than or equal to a safe current limit.

4. A method for determining cell imbalance of a battery comprising:
    applying a charge current to a battery, wherein the battery comprises a plurality of cell strings;
    monitoring the battery charge current;
    counting a charge time for every cell of a first cell string of the plurality of cell strings based on sensing a first sudden reduction in the battery charge current, wherein the sudden current reduction indicates a charge completion of one of the first cell string;
    counting a charge time for every cell of a second cell string of the plurality of cell strings based on sensing a second sudden reduction in the battery charge current, wherein the sudden current reduction indicates a charge completion of one of the second cell string;
    determining a charge time difference between the first and second cell strings of the plurality of cell strings; and
    comparing the charge time difference between the first and second cell strings of the plurality of cell strings with a predetermined acceptable charge time difference for the plurality of cell strings of the battery, wherein a condition in which the charge time difference is greater than the predetermined acceptable charge time difference indicates a cell imbalance condition of the battery.

5. The method of claim 4, wherein the charge time difference indicates a good battery when said charge time difference is equal to or less than said predetermined acceptable charge time difference.

6. The method of claim 4 further comprising counting the charge time for every cell string by monitoring a charge current to every individual cell string.

7. The method of claim 4, wherein the charge time difference is calculated from an absolute value for a difference of the charge time between any two cell strings of the plurality of cell strings.

8. The method of claim 4, wherein the charge time is affected by battery conditions, wherein the battery conditions comprise at least a state-of-charge level.

9. The method of claim 4, further comprising determining an impending cell imbalance condition by comparing the charge time of one of the plurality of cell strings with an acceptable charge time for the plurality of cell strings.

10. The method of claim 9, wherein said charge time indicates an impending cell imbalance condition when said charge time is shorter than said acceptable charge time.

11. The method of claim 4 further comprising determining a cell imbalance condition at individual cell levels.

* * * * *